United States Patent [19]

LaMarche

[11] Patent Number: 4,904,858

[45] Date of Patent: Feb. 27, 1990

[54] PROGRAMMABLE OPTICAL LOGIC DEVICES OPERABLE BY MEASURING THE RATIO OF OPTICAL DATA SIGNAL POWER TO OPTICAL REFERENCE THRESHOLD POWER

[75] Inventor: Robert E. LaMarche, Atlantic Highlands, N.J.

[73] Assignees: American Telephone and Telegraph Company, New York, N.Y.; AT&T Bell Laboratories, Murray Hill, N.J.

[21] Appl. No.: 359,252

[22] Filed: May 31, 1989

[51] Int. Cl.$^4$ ............................................... H01J 40/14
[52] U.S. Cl. .............................. 250/211 J; 250/213 A
[58] Field of Search ................. 250/211 J, 213 A, 578; 357/24 LR, 30 R; 365/109, 110, 112; 377/102

[56] References Cited

U.S. PATENT DOCUMENTS

| | | | |
|---|---|---|---|
| 4,546,244 | 10/1985 | Miller | 250/211 J |
| 4,731,528 | 3/1988 | Neumann et al. | 250/213 A |
| 4,751,378 | 6/1988 | Hinton et al. | 250/211 J |
| 4,754,132 | 6/1988 | Hinton et al. | 250/211 J |

OTHER PUBLICATIONS

D. A. B. Miller et al., Appl. Phys. Lett., vol. 45, No. 1, Jul. 1984, "Novel Hybrid Optically Bistable Switch . . . ", pp. 13-15.
S. D. Smith, Applied Optics, vol. 25, No. 10, May 15, 1986, "Optically Bistability, Photonic Logic . . . ", pp. 1550-1564.
A. L. Lentine et al., Conf. Laser Electro-Optics, Post-deadline Paper No. ThT12-1, "The Symmetric Self Electro-Optic . . . ", pp. 249-250, 1987.
A. L. Lentine et al., Appl. Phys. Lett., vol. 52, No. 17, Apr. 25, 1988, "Symmetric Self-electro-optic . . . ", pp. 1419-1421.
A. L. Lentine et al., Conf. Lasers & Electro-Optics, Apr. 1988, "Photonic Ring Counter . . . ".
H. S. Hinton, IEEE J. on Selected Areas in Comm., vol. 6, No. 7, Aug. 1988, "Architectural Considerations . . . ", pp. 1209-1226.

Primary Examiner—David C. Nelms
Assistant Examiner—William L. Oen
Attorney, Agent, or Firm—Gregory C. Ranieri

[57] ABSTRACT

Combinatorial (Boolean) logical functions are provided in a programmable optical logic device by combining a symmetric self-electrooptic effect device (S-SEED) with a logic control element for optically programming the S-SEED to initiate logic operations in a predetermined mode. A predetermined reference threshold optical signal is applied to one input of the S-SEED while first and second optical data signals are jointly applied to another input of the S-SEED to permit the desired combinatorial logic operation to be performed on the optical data signals by the optical logic device. As such, the programmable optical logic device is said to perform threshold logic operations. Logic operations which may be programmed into the optical logic device include AND, OR and NOT functions. A single optical signal is provided as output from each optical logic device. In one embodiment of the invention, a first threshold optical signal is utilized to perform AND logic operation whereas a second threshold optical signal is employed for performing OR logic operation. Exclusive-OR operation is provided by performing both AND and OR logic operations in parallel on the same data signals with separate S-SEED devices and then using an S-SEED S-R flip-flop to process the output optical signals from each logic gate (e.g., AND output to R input and OR output to S input) for generating an Exclusive-OR output signal.

14 Claims, 3 Drawing Sheets

FIG. 2

| A | B | C | REF | Q |
|---|---|---|---|---|
| 0 | 0 | $2P_0$ | $\sqrt{2P_0(P_0+P_1)}$ = TH 1 | 0 |
| 0 | 1 | $P_0+P_1$ | " " " | 1 |
| 1 | 0 | $P_1+P_0$ | " " " | 1 |
| 1 | 1 | $2P_1$ | " " " | 1 |

FIG. 3

| A | B | C | REF | Q |
|---|---|---|---|---|
| 0 | 0 | $2P_0$ | $\sqrt{2P_1(P_0+P_1)}$ = TH2 | 0' |
| 0 | 1 | $P_0+P_1$ | " " " | 0' |
| 1 | 0 | $P_1+P_0$ | " " " | 0' |
| 1 | 1 | $2P_1$ | " " " | 1' |

FIG. 5

| A | B | R | S | Q |
|---|---|---|---|---|
| 0 | 0 | 0' | 0 | 0 |
| 0 | 1 | 0' | 1 | 1 |
| 1 | 0 | 0' | 1 | 1 |
| 1 | 1 | 1' | 1 | 0 |

PROGRAMMABLE OPTICAL LOGIC DEVICES OPERABLE BY MEASURING THE RATIO OF OPTICAL DATA SIGNAL POWER TO OPTICAL REFERENCE THRESHOLD POWER

CROSS-REFERENCE TO RELATED APPLICATION

This application is related to commonly assigned and co-pending U.S. patent application Ser. No. 341,524 filed Apr. 21, 1989.

TECHNICAL FIELD

This invention relates to lightwave devices and, more particularly, to photonic semiconductor devices including self-electrooptic devices.

BACKGROUND OF THE INVENTION

Computing, communications, switching and interconnection are technical fields which have deemonstrated both applicability and need for optics and optical devices. In these technical fields, one class of device which is needed is an optical logic device. For the optical logic device, data or information carrying signals incident on the device control the state of the device in such a way that some combinatorial (Boolean) or memory (latch) function or some combination or combinatorial (Boolean) and/or memory (latch) functions is performed on the incident signals.

Nonlinear Fabry-Perot etalons have been suggested as all-optical devices which can provide optical logic functions. See S. D. Smith, *Applied Optics,* Vol. 25, No. 10, pp. 1150–64 (1986) and H. S. Hinton, *IEEE Journal on Selected Areas in Communications,* Vol. 6, No. 7, pp. 1209–26 (1988). One drawback to the use of nonlinear Fabry-Perot etalons in high speed operation is that incident controlling signals such as clock and data signals must be separated in wavelength so that one wavelength corresponds to an absorption peak of the nonlinear material in the etalon. Such a limitation is necessary to permit switching or tuning the nonlinear Fabry-Perot etalon between transmissive and reflective states. As a result of this method of operation, the input wavelength is different from the output wavelength thereby excluding the possibility of cascading these devices one after the other. While required wavelength differences pose significant limitations, it cannot be avoided that other limitations arise because temperature variations cause the etalon to undergo changes with respect to location of resonance peaks for the cavity. In turn, the etalon may or may not be responsive to input optical signals. Moreover, intensity variations of the incident signals can cause the nonlinear Fabry-Perot etalon to change state in a haphazard manner or not at all.

Self electrooptic effect devices have also been shown to be suitable for operating as sequential memory elements realized as S-R flipflops. See U.S. Pat. Nos. 4,754,132 and 4,751,378. These bistable memory elements are affected by past inputs as well as present inputs. Logical interconnection of these memory elements permits realization of shift register circuits such as a photonic ring counter. See *Proceedings of the Conference on Lasers and Electrooptics,* paper TUE4 (1988). However, the utility of such photonic memory devices is limited in computing, communications, and switching applications without the existence of photonic combinatorial logic elements such as AND, OR, Exclusive-OR gates and the like.

Recently, symmetric self electrooptic devices have been utilized in a combinatorial logic gate for producing the NOR function. See *Proceedings of the Conference on Lasers and Electrooptics,* paper TUE4 (1988). In this paper, it was stated that OR, NAND and AND functions were demonstrated. Proper operation of the devices described requires that each optical data signal and its logical complement be supplied to the logic gate. As a result, additional hardware such as a beam splitter and an optical inverter are required for each optical data signal to obtain a complementary data signal, if one is not readily available. Even though AND and OR logic gates are shown or described in the reference cited above, it should be noted that the reference nowhere suggests the realization of and exclusive-OR gate. Exclusive-OR gates are important because it is not possible to realize photonic encoders or scramblers or their inverses without Exclusive-OR gates in the feedback path and at other interconnection points of a photonic shift register.

SUMMARY OF THE INVENTION

Combinatorial (Boolean) logic functions are provided in a programmable optical logic device by combining a symmetric selfelectrooptic effect device (S-SEED) with a logic control element for optically programming the S-SEED to initiate logic operations in a predetermined mode. A predetermined threshold optical signal is applied to one input of the S-SEED while first and second optical data signals are jointly applied to another input of the S-SEED to permit the desired combinatorial logic operation to be performed on the optical data signals by the optical logic device. As such, the programmable optical logic device is said to perform threshold logic operations. Logic operations which may be programmed into the optical logic device include AND, OR and NOT functions. A single optical signal is provided as output from each optical logic device.

In one embodiment of the invention, a first threshold optical signal is utilized to perform AND logic operation whereas a second threshold optical signal is employed for performing OR logic operation. Exclusive-OR operation is provided by performing both AND and OR logic operations in parallel on the same data signals with separate S-SEED devices and then using an S-SEED S-R flip-flop to process the output optical signals from each logic gate (e.g., AND output to R input and OR output to S input) for generating an Exclusive-OR output signal.

In accordance with the principles of the invention, the programmable optical logic device based on the S-SEED permits all optical signals to be at the same wavelength. Accordngly, the programmable optical logic device is readily cascadable.

According to another aspect of the invention, the programmable optical logic device is capable of being integrated with other devices including other optical logic devices in large arrays on the order of 100×100 using standard modest fabrication techniques.

According to still another aspect of the invention, the programmable optical logic device may be operated over a wide range of wavelengths covering several nanometers whereas the nonlinear Fabry-Perot etalon devices are operable over an extremely narrow range of only several angstroms.

BRIEF DESCRIPTION OF THE DRAWING

A more complete understanding of the invention may be obtained by reading the following description of specific illustrative embodiments of the invention in conjunction with the appended drawing in which:

FIGS. 2 and 3 are logic truth tables related to different modes of operation for the device shown in FIG. 1;

FIG. 5 shows a logic truth table related to the operation of the gate depicted in FIG. 4.

DETAILED DESCRIPTION

The self-electrooptic effect device (SEED), the symmetric self-electrooptic effect device (S-SEED), and the fabrication techniques applicable to both have been fully described in U.S. Pat. Nos. Re. 32,893; 4,546,244; 4,751,378; and 4,754,132 as well as in the following technical references: D. A. B. Miller et al., *Appl. Phys. Lett.*, 45(1), pp. 13-15 (1984) and A. L. Lentine et al., *Appl. Phys. Lett.*, 52(17), pp. 1419-21 (1988). The references cited above and their teachings are expressly incorporated herein by reference.

Figure 1:
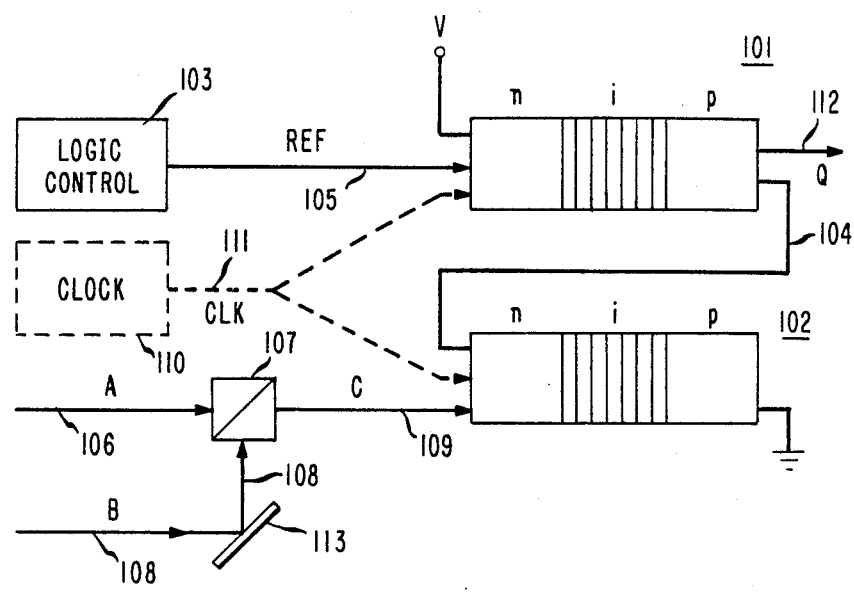
FIG. 1 depicts an embodiment of a programmable optical logic device in accordance wih the principles of the invention.

An S-SEED is a four port device having at least two optical inputs and two optical outputs. The S-SEED device is formed by electrically interconnecting multiple quantum well p-i-n diode 101 in series with multiple quantum well p-i-n diode 102 via lead 104 as shown in FIG. 1. The diodes are subject to a reverse bias potential, V. When the diodes are connected in this manner, a single optical output shown as signal Q on output lead 112 is available for use by subsequent devices. An output optical signal from diode 102 is not desirable for further use even though one of the diodes is on when the other is off because, as will be shown below, the input signal levels and, therefore, the output signal levels from this diode are not well controlled.

During S-SEED operation, it is understood that one of the diodes is in an absorbing state when the other diode is in a transmissive state. State changes for the S-SEED are known to occur as a function of the ratio of the powers of the input signals and not as a function of the absolute intensity of the input signal. A state change is observed from outputs changing levels such as Q changing from 0 to 1 or vice versa.

Particularly, the S-SEED comprising diodes 101 and 102 is caused to switch from a first state to a second state when the optical signal power incident on diode 102 divided by the optical signal power incident on diode 101 exceeds threshold, T. On the other hand, the S-SEED is caused to switch from the second state to the first state when the optical signal power incident on diode 101 divided by the optical signal power incident on diode 102 exceeds the threshold, T.

In an example from experimental practice, the threshold for S-SEED devices based on the GaAs/AlGaAs semiconductor material system has been found to be approximately 1.1. From this example, it has been determined that the S-SEED is in the first state (Q=0) when the optical output power from diode 101 is approximately equal to 19% of the optical power incident on the same diode. It has also been determined from this example that the S-SEED is in the second state (Q=1) when the optical output power from diode 101 is approximately equal to 32% of the optical power incident on the same diode.

In operation, optical input signal beams 105 and 109 are incident on the S-SEED comprising diodes 101 and 102. The optical signal beams are grouped to be incident on specific diodes as follows: optical signal beam 105 representing optical threshold reference signal REF from logic control 103 is incident on diode 101 and optical signal beam 109 representing data signal C, which is the power sum of data signals A and B, is incident on diode 102. Optical signal beams 105 and 109 can effect a change of output state of the S-SEED. The amplitude of these optical signal beams is chosen to have sufficient contrast between a logical 0 and a logical 1 level to insure that the S-SEED is not forced into a bistable region wherein the output level is ambiguous. An exemplary contrast of 2:1 has been found to satisfy the above criteria.

It is possible to obtain a sum of data signals A and B as follows. Input data signal beam 106(signal A) is directed as shown onto an input port of beam combiner 107; input data signal beam 108(signal B) is redirected by mirror 113 onto another input port of beam combiner 107. Beam combiner 107 produces an output beam 109 as data signal C having a power level being substantially equivalent to the sum of the power levels of signals A and B.

Clock 110 has been shown in dashed lines as have its output optical signal corresponding to clock signals to indicate that clock 110 is an optional element and is not necessary to the practice of this invention. Optical signal beams 111 are generally supplied to each diode in an S-SEED. It is understood that the optical signal beams 111 corresponding to clock signals, each denoted as CLK, have substantially equal intensities which are initially low when compared to the data and reference threshold signal beam intensities. Clock signal beams 111 may be applied to the S-SEED to read out the state of the logic gate so that the level of the output signal beam Q is related to the level of the clock signal beam. It should be noted that the application of clock signal beams to the S-SEED may provide a means for obtaining dual-rail outputs, that is, complementary outputs wherein the Q output emanates from diode 101 and the $\overline{Q}$ output emanates from diode 102.

With respect to the clock signal beams, it is understood that it is preferable to apply the clock signal beams during intervals when the data signals and the reference threshold signal are inactive. Since the output state of the S-SEED is determined by the ratio of the incident signal powers on the diodes, the presence of a clock signal simultaneously with the data and reference threshold signals tends to degrade the contrast ratio of the input beams possibly resulting in the failure of the S-SEED to switch states. While it is understood that the clock signals are generally applied to read out the state of the S-SEED via complementary output signal beams, Q and $\overline{Q}$ (not shown), it is desirable to maintain a relatively small difference between the intensities of optical signal beams 111 as well as a sufficient intensity so that the state of the S-SEED is read without interference or alteration. For most S-SEEDs, it has been determined that a ratio of powers for data signal A to data signal B exceeding 1.1 or falling below 0.9 causes switching of the S-SEED wherein it is understood that the optical hysteresis loop is centered about a point where the powers of the reference threshold and data signals are substantially equal.

The programmable optical logic device of FIG. 1 comprises logic control 103, series connected diodes 101 and 102 and, if necessary, beam combining elements (elements 113 and 107) for combining both optical data signal beams 106 (A) and 108 (B) to be incident on the same diode of the S-SEED. Optical signal beams 106 and 108 are the data signals on whih the combinatorial logic functions are to be performed. See, for example, FIGS. 2, 3 and 5. As shown, optical signal beam 109 (C) includes the combination of individual data signals A and B. When performing a combinatorial logic (Boolean) function, the programmable optical logic device performs it on the individual data signals A and B. That is, the programmable optical logic device performs an AND function as $f(A,B)=A \cdot B$ and an OR function as $f(A,B)=A+B$.

As shown in FIG. 1, the embodiment of the present invention includes an exemplary combination of diodes in the S-SEED wherein the diodes are series connected multiple quantum well p-i-n diodes such as AlGaAs/GaAs semiconductor diodes. It should also be noted that an alternative embodiment of the diode pair is contemplated herein. For example, either diode 101 or diode 102 may be replaced by a standard p-i-n diode which does not employ a quantum well intrinsic region. As such, the remaining diode would be required to be a quantum well p-i-n diode so that the resulting arrangement would be a self electro-optic effect device having a p-i-n diode as its load. In such an arrangement, the active output and, in fact, the only output would be derived from the output of the quantum well p-i-n diode.

In the prior art, memory logic elements (S-R flip-flops) based on the S-SEED required one data signal to be applied to one diode while the other data signal was applied to the other diode. In the more recent prior art, programmable optical combinatorial logic gates based on the S-SEED required both data signals to be combined and incident on the same diode of the S-SEED while the complements of both data signals were combined and incident on the other diode. In contrast to these approaches, the present programmable optical combinatorial logic gate programs the particular Boolean function (AND,OR) with a reference threshold signal beam incident on one diode of the S-SEED while the combined data signal beams are incident on the other diode.

As stated above, logic control 103 programs a paricular Boolean function to be performed so that the entire combination of the S-SEED and logic control 103 acts as a programmable optical logic device according to the desired Boolean function rules. Logic control 103 generates a substantially constant optical power beam 105 designated as REF. In effect, this optical beam acts as a reference threshold against which the combined power of data signals A and B ($p_C = p_A + p_B$) is proportionally measured. That is, if $$\frac{p_C}{p_{REF}} > T \approx 1.1$$

where $p_{REF}$ is the power of signal REF, then diode 101 reverts to a substantially transmissive state and generates an output signal Q whose power is approximately 32% of the input signal (REF) power thereby setting Q to a logical "1". If $$\frac{p_{REF}}{p_C} > T \approx 1.1,$$

then diode 101 reverts to a substantially absorption state and generates the output signal Q at a power level of approximately 19% of the input signal (REF) power thereby setting Q to a logical "0".

In order to understand the programmable operation of this device, attention should be directed to FIGS. 2 and 3. A description of the operation for noninverting logic functions, AND and OR, follows below.

FIG. 2 shows a truth table including optical signal power levels for OR gate operation of the programmable optical logic device in FIG. 1 with respect to supplied optical data signals A and B. The power level for the reference threshold signal is set at approximately $(2p_0(p_0+p_1))^{\frac{1}{2}}$ denoted as TH1, where $p_0$ is the optical power of an input signal at a logical "0" level and $p_1$ is the optical power of an input signal at a logical "1" level. Since the power of an input signal at a logical "1" level is greater than the power of an input signal at a logical "0" level, it should be clear that the prescribed power level for signal REF is sufficient to cause switching of signal Q to a logical "1" state when data signals A and B are at logically opposite levels or both at the logical "1" level. Also, the precribed power level for signal REF is sufficient to cause signal Q to be at or to be switched to a logical "0" level when data signals A and B are both at the logical "0" level. Accordingly, the programmable optical logical device of FIG. 1 when operated using signals at levels in accordance with the truth table shown in FIG. 2 is capable of operating as a logical OR gate.

FIG. 3 shows a truth table including optical signal power levels for AND gate operation of the programmable optical logic device in FIG. 1 with respect to supplied optical data signals A and B. The power level for the reference threshold signal is set at approximately $(2p_1(p_0+p_1))^{\frac{1}{2}}$ denoted as TH2, where $p_0$ is the optical power of an input signal at a logical "0" level and $p_1$ is the optical power of an input signal at a logical "1" level. Since the power of an input signal at a logical "1" level is greater than the power of an input signal at a logical "0" level (i.e., $p_1 > p_0$), it should be clear that the prescribed power level or signal REF is sufficient to cause switching of signal Q to a logical "1" state when data signals A and B are both at the logical "1" level. Also, the prescribed power level for signal REF is sufficient to cause switching of signal Q to a logical "0" level when data signals A and B are at logically opposite levels or both at the logical "0" level. Accordingly, the programmable optical logical device of FIG. 1 when operated using signals at levels in accordance with the truth table shown in FIG. 3 is capable of operating as a logical AND gate.

It should be clear to those skilled in the art that the prime marks showing on the logical levels for the Q output in FIG. 3 indicate that there is a difference from the levels shown in FIG. 2. This arises because the reference threshold signal REF supplied to diode 101 has a different level for AND gate operation than for OR gate operation. As a result, the output signal Q from diode 101 is correspondingly changed to a slightly higher level when AND gate operation is desired.

It should be noted that the optical power levels shown in the truth tables of FIGS. 2 and 3 for combined data signal C are found by summing the optical power levels for the appropriate logical states of individual data signals A and B. In order to determine appropriate levels for the logical states of input data signals, it is suggested that the logical "0" and "1" input power levels to be set substantially equal to the logical "0" and "1" output power level from a preceding device normalized to random power units (p.u.). That is, a logical "1" is assumed to have a normalized optical power level of 32 p.u. and a logical "0" is assumed to have a normalized optical power level of 19 p.u. Using the normalized power units, it is possible to understsand the difference in output signal (Q) logical levels for AND gate and OR gate operation as follows:

|  | "0" | "1" |
| --- | --- | --- |
| AND | 10.86 | 18.28 |
| OR | 8.36 | 14.09 |

It is understood that the description above relating to normalized power units is made by way of example and for clarity in understanding the present invention and not for purposes of limitation.

Figure 4:
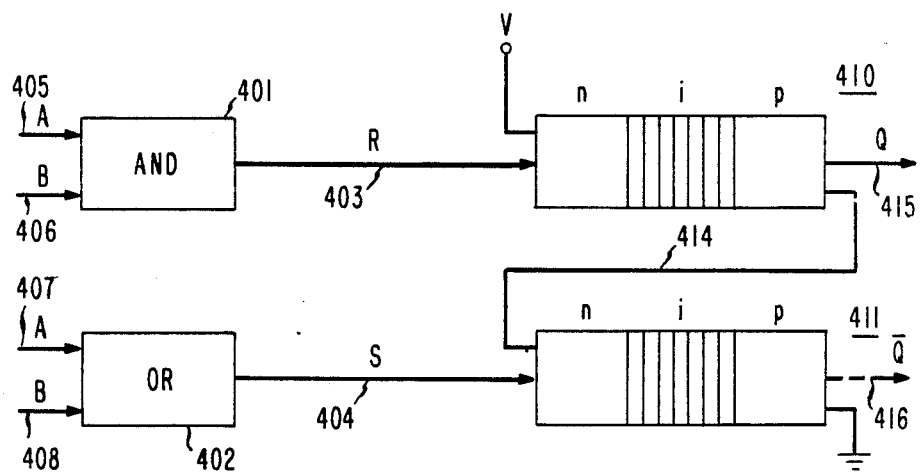
FIG. 4 shows an exemplary optical exclusive-OR gate in accordance with the principles of the invention.

The exclusive-OR gate and its operational truth table are shown in FIGS. 4 and 5, respectively. As shown, the optical exclusive-OR gate includes optical AND gate 401 as described above in reference to FIGS. 1 and 3, optical OR gate 402 as described in reference to FIGS. 1 and 2, and a standard S-R flip-flop comprising series connected diode 410 and 411. Data input signals A (beams 405 and 407) and B (beams 406 and 408) are supplied to the exclusive-OR gate. Intermediate data signals R (beam 403) and S (beam 404) are output from the initial stage of logic gates. Output signal Q represents the exclusive-OR output. Also, shown in FIG. 4 is a complementary output signal, $\overline{Q}$, from the exclusive-OR gate which permits dual-rail operation (complementary output signal generation) from the optical exclusive-OR gate.

While it has been omitted from FIG. 4, it should be clear to those skilled in the art that a clock source for generating optical clock signals to be supplied to each diode of the S-R flip-flip is contemplated for optional incorporation into the arrangement in FIG. 4. In such an optional arrangement, it may be necessary to inhibit the intermediate data signals during periods when the clock signals are being applied. Use of such clock signals is shown in articles by A. Lentine et al., *Postdeadline Papers, Proceedings of Conference on Lasers and Electrooptics,* paper ThT12 (1987) and *Proceedings of Conference on Lasers and Electrooptics,* paper TUE3 (1988) as well as the above-identified '132 patent. It is understood that the absence of clock signals permits the combinatorial logic gates to exhibit valid output levels at substantially all times rather than only during a particular clocked interval.

Optical input beams 405 and 407 corresponding to data signal A may be formed by passing data signal A through a beam splitter (not shown) so that the two substantially identical optical beams are incident on the appropriate logic gate. A similar approach may be employed to create optical input beams 406 and 408 corresponding to data signal B and incident upon the appropriate logic gates.

AND gate 401 is an optical AND gate realized in accordance with FIGS. 1 and 3 and the description related thereto. AND gate 401 operates on data signals A and B to generate optical beam 403 corresponding to intermediate data signal R which is equal to A·B.

OR gate 402 is an optical OR gate realized in accordance with FIGS. 1 and 2 and the description related thereto. OR gate 402 operates on data signals A and B to generate optical beam 404 corresponding to intermediate data signal S which is equal to A+B.

Intermediate data signal R is incident on diode 410 while intermediate data signal S is incident on diode 411. Diodes 410 and 411 are connected in series via lead 414 and subject to reverse bias potential V. Accordingly, diodes 410 and 411 form an S-SEED S-R flip-flop. The S-R flip-flop generates output signal beams 415 and 416 which correspond to signals Q and $\overline{Q}$, respectively. In operation, output signal Q represents the exclusive-OR function performed on data signals A and B, that is, $Q = A \oplus B$. Output signal $\overline{Q}$ represents a complement of output signal Q. It should be noted that the prescribed values of the reference thresholds used in AND gate 401 and OR gate 402 permit generation of intermediate data signals R and S at levels which are sufficient to switch the S-R flip-flop from one logical state to another. The prime symbols used in connection with the logical "1" and "0" states shown in FIG. 5 have the same meaning as that described above.

Figure 6:
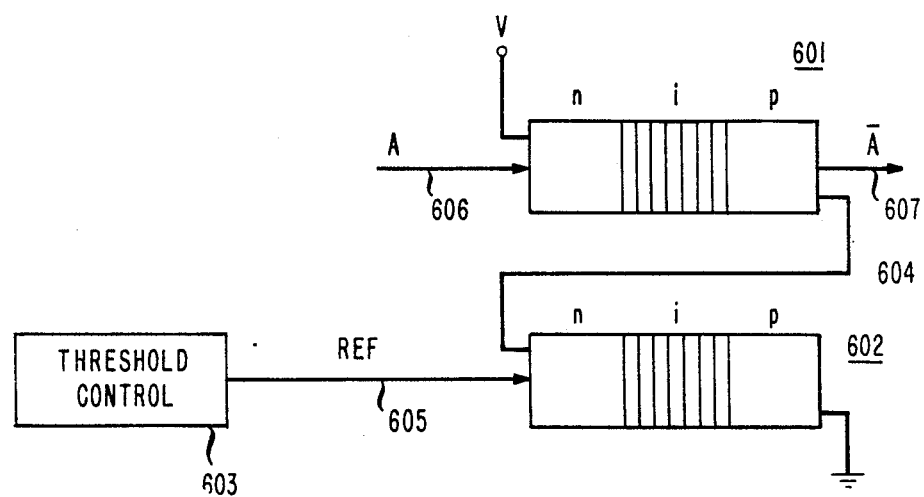
FIG. 6 shows an embodiment of an inverter in accordance with the principles of the invention.

FIG. 6 shows a representation of an inverter or logical NOT gate. The gate comprises threshold control 603 which generates a reference threshold signal at optical beam 605. This beam is incident on the set (S) input of the S-R flip-flop compising series connected diodes 601 and 602. The diodes are connected in series via lead 604 and are subject to a reverse bias potential V. Data signal A shown as optical beam 606 is supplied to the reset (R) input of the S-R flip-flop. Complement of data signal A, that is, signal $\overline{A}$, is output by diode 601 as optical beam 607. The power level of the reference threshold signal from threshold control 603 is selected as $(p_0 p_1)^{\frac{1}{2}}$.

In one example for experimental practice, threshold reference signal beam REF was generated by a standard acousto-optic modulated HeNe laser at 633 nm using peak power levels from approximately 6 $\mu$W to approximately 100 $\mu$W. The reference threshold signal for an OR gate may be approximately 6.6 $\mu$W whereas the reference threshold signal for an AND gate may be approximately 8.6 $\mu$W. Clearly, any wavelength that is significantly absorbed by the diodes can be used. In the particular example cited above, the S-SEED comprises quantum well p-i-n diodes with AlGaAs/GaAs quantum well intrinsic regions (nominally 850 nm). Exemplary data signal levels incident on the logic gate have been estimated at approximately 4.8 $\mu$W and 2.85 $\mu$W for the complementary input beams, that is, logical "1" and logical "0", respectiveley.

From the description above, it should be clear to those skilled in the art that the programmable optical logic device described herein either may be operated as a dedicated logic gate or may be operated in a programmable mode wherein the logic function performed may vary from time period to time period.

The programmable optical logic device can be realized to be substantially immune to intensity variations of the optical signals by deriving the optical signals from the same source. Immunity would result because the S-SEED provides switching in accordance with the ratio of input powers not the absolute intensity of the input optical signals.

As stated above, the programable optical logic device is capable of being integrated with other devices including other optical logic devices in large arrays on the order of 100×100 using standard modest fabrication techniques. See M. E. Prise et al., *OSA Topical Meeting on Photonic Switching* (Salt Lake City), paper PDP5, (1989). The array generation technology presently known permits optical power tracking to enhance immunity to intensity variations.

In addition to the benefits described above, other benefits derived from the programmable optical logic device are potential time sequential gain without critical biasing by using the optional clock signals, high gain (low power in vs. high power out), and large fanout.

I claim:

1. An arrangement for performing a Boolean logic operation on first and second optical data signals, said arrangement including:
   first and second photodiodes connected together in series cascade as a self electrooptic effect device having a predetermined threshold, at least said first photodiode including a semiconductor quantum well region, said first photodiode for generating an optical output signal having first and second levels;
   means for generating an optical reference threshold signal, said optical reference threshold signal being incident upon said first photodiode to control the Boolean logic operation being performed by the arrangement;
   said first and second optical data signals being incident upon said second photodiode; and
   the arrangement for generating said optical output signal at said first level when a ratio of optical reference threshold signal power to total optical data signal power exceeds the predetermined threshold and for generating said optical output signal at said second level when a ratio of total optical data signal power to optical reference threshold signal power exceeds the predetermined threshold.

2. The arrangement defined in claim 1 further including means for combining said first and second optical data signals into a combined data signal, wherein said combined data signal is incident on said second photodiode.

3. The arrangement defined in claim 1, said arrangement for performing a logical OR operation of said first and second optical data signals wherein each optical data signal has a first power level, $p_0$, representing a first logical state and a second power level, $p_1$, representing a second logical state, and said optical reference threshold signal power is greater than $2p_0$ and is less than $p_0+p_1$, where $p_1 > p_0$.

4. The arrangement defined in claim 3 further including means for combining said first and second optical data signals into a combined data signal, wherein said combined data signal is incident on said second photodiode.

5. The arrangement defined in claim 4 wherein the optical reference threshold signal power is substantially equal to $(2p_0(p_0+p_1))^{\frac{1}{2}}$.

6. The arrangement defined in claim 1, said arrangement for performing a logical AND operation of said first and second optical data signals wherein each optical data signal has a first power level, $p_0$, representing a first logical state and a second power level, $p_1$, representing a second logical state, and said optical reference threshold signal power is greater than $p_0+p_1$ and is less than $2p_1$, where $p_1 > p_0$.

7. The arrangement defined in claim 6 further including means for combining said first and second optical data signals into a combined data signal, wherein said combined data signal is incident on said second photodiode.

8. Tthe arrangement defined in claim 7 wherein the optical reference threshold signal power is substantially equal to $(2p_1(p_0+p_1))^{\frac{1}{2}}$.

9. An arrangement for performing a logic operation on an optical data signal, said arrangement including:
   first and second photodiodes connected together in series cascade as a self electrooptic effect device having a predetermined threshold, at least said first photodiode including a semiconductor quantum well region, said first photodiode for generating an optical output signal having first and second levels;
   means for generating an optical reference threshold signal, said optical reference threshold signal being incident upon said second photodiode to control the logic operation being performed by the arrangement to be logical inversion of said optical data signal;
   said optical data signal being incident upon said first photodiode; and
   the arrangement for generating said optical output signal at said first level when a ratio of optical reference threshold signal power to total optical data signal power exceeds the predetermined threshold and for generating said optical output signal at said second level when a ratio of total optical data signal power to optical reference threshold signal power exceeds the predetermined threshold.

10. The arrangement defined in claim 9 wherein said optical data signal has a first power level, $p_0$, representing a first logical state and a second power level, $p_1$, representing a second logical state, and said optical reference threshold signal power is greater than $p_0$ and is less than $p_1$.

11. The arrangement as defined in claim 10 wherein the optical reference threshold signal power is substantially equal to $(p_0 p_1)^{\frac{1}{2}}$.

12. An arrangement for performing a Boolean logic operation on first and second optical data signals, said arrangement including first and second logic gates and a logic memory element:
   first and second logic gates, each gate comprising first and second photodiodes connected together in series cascade as a self electrooptic effect device having a predetermined threshold, at least said first photodiode including a semiconductor quantum well region, said first photodiode for generating an optical output signal having first and second levels; said first and second optical data signals being incident upon said second photodiode; means for generating an optical reference threshold signals, one of said optical reference threshold signals being incident upon said first photodiode to control the Boolean logic operation being performed by each logic gate; each logic gate for generating said optical output signal at said first level when a ratio of optical reference threshold signal power to total optical data signal power exceeds the predetermined threshold and for generating said optical output signal at said second level when a ratio of total optical data signal power to optical reference threshold signal power exceeds the predetermined threshold;

said first logic gate for performing a logical AND operation of said first and second optical data signals wherein each optical data signal has a first power level, $p_0$, representing a first logical state and a second power level, $p_1$, representing a second logical state, and said optical reference threshold signal power supplied to said first logic gate is greater than $p_0+p_1$ and is less than $2p_1$, where $p_1>p_0$, and said second logic gate for performing a logical OR operation of said first and second optical data signals wherein said optical reference threshold signal power supplied to said second logic gate is greater than $2p_0$ and is less than $p_0+p_1$;

said logic memory element comprising third and fourth photodiodes connected together in series cascade as a self electrooptic effect device having a predetermined threshold, at least said third photodiode including a semiconductor quantum well region, said third photodiode for generating an optical output signal having first and second levels, said optical output signal from said first logic gate being supplied to said third photodiode and said output signal from said second logic gate being supplied to said fourth photodiode;

said arrangement for generating said optical output signal from said logic memory element as an exclusive-OR function of said first and second optical data signals.

13. The arrangement defined in claim 12 further including means for combining said first and second optical data signals into a combined data signal, wherein said combined data signal is incident on said second photodiode of each of said first and second logic gates.

14. The arrangement defined in claim 13 wherein said optical reference threshold signal power to said first logic gate is substantially equal to $(2p_1(p_0+p_1))^{\frac{1}{2}}$, and said optical reference threshold signal power to said second logic gate is is substantially equal to $(2p_0(p_0+p_1))^{\frac{1}{2}}$.

* * * * *